(12) United States Patent
Matsukawa

(10) Patent No.: US 6,373,555 B1
(45) Date of Patent: Apr. 16, 2002

(54) APPARATUS FOR PROJECTING A MASK PATTERN ONTO A WAFER WITH REDUCED DEGRADATION OF OPTICAL ELEMENTS

(75) Inventor: Yoshihiko Matsukawa, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 52 days.

(21) Appl. No.: 09/634,848

(22) Filed: Aug. 8, 2000

(30) Foreign Application Priority Data

Dec. 21, 1999  (JP) .......................................... 11-362018

(51) Int. Cl.[7] ...................... G03B 27/72; G03B 27/54; G03B 27/42
(52) U.S. Cl. .............................. 355/71; 355/67; 355/53
(58) Field of Search ........................ 355/53, 55, 67–71, 355/77; 356/399–401; 378/34, 84; 250/548

(56) References Cited

U.S. PATENT DOCUMENTS 6,208,707 B1 * 3/2001 Oshino ........................ 378/34
6,271,909 B1 * 8/2001 Suzuki et al. .................. 355/53

FOREIGN PATENT DOCUMENTS

JP          57-164528 A   * 10/1982

* cited by examiner

Primary Examiner—Russell Adams
Assistant Examiner—Hung Henry Nguyen
(74) Attorney, Agent, or Firm—Volentine Francos, PLLC

(57) ABSTRACT

An apparatus for projecting a mask pattern onto a wafer has a light source, a pair of light selectors, and at least one optical element disposed between the light selectors. The first light selector selectively places an alignment filter between the light source and the optical element. The second light selector selectively places a shutter or an exposure filter in the path of light received from the optical element. The apparatus can be operated in a shut state, an alignment state, and an exposure state, the alignment filter being removed from the light path only in the exposure state. The optical element is thereby protected both from prolonged exposure to unfiltered light, and from thermal stress caused by repeated cycling between illuminated and non-illuminated conditions.

7 Claims, 5 Drawing Sheets

APPARATUS FOR PROJECTING A MASK PATTERN ONTO A WAFER WITH REDUCED DEGRADATION OF OPTICAL ELEMENTS

BACKGROUND OF THE INVENTION

The present invention relates to a light-exposure apparatus used in semiconductor fabrication, more particularly to the arrangement of the shutter and filters of the apparatus.

FIG. 1 schematically shows the structure of a conventional light-exposure apparatus 50 having a light source such as a mercury lamp 51, and a shutter 52 mounted just below the light source. The apparatus 50 has three operating states: a shut state, an alignment state, and an exposure state. FIG. 1 illustrates the light path in the alignment state.

The shutter 52 moves between a shut position (indicated by dotted lines) in which it blocks the light from the mercury lamp 51, and an open position (indicated by solid lines) in which the light is not blocked and can be used for alignment and exposure purposes. The light is refracted by the transmitting part 53a of a convex secondary lens 53, reflected by a primary mirror 54, then reflected by an aluminum coating on the reflecting part 53b of the secondary lens 53. After passing through a slit 55, the light is reflected by the reflecting surface 56a of a toroidal mirror 56, then passes through one of two filters, either an exposure filter 57 that transmits light of comparatively short wavelengths, or an alignment filter 58 that transmits light of longer wavelengths. In the alignment state, these filters are positioned so that the light passes through the alignment filter 58, as shown.

The elements described so far constitute the illumination system 65 of the apparatus. The light emerging from the illumination system 65 is further reflected by three relay mirrors 59, 60, 61, then illuminates a semiconductor wafer through a mask. The wafer and mask are not shown in FIG. 1.

The wafer is coated with a photoresist material that is insensitive to the wavelengths transmitted by the alignment filter 58. This light can therefore be used for alignment of the wafer and mask. After alignment is completed, the exposure filter 57 is moved into the light path, replacing the alignment filter 58, and light of a shorter, more energetic wavelength is used to transfer the mask pattern to the photoresist.

In the shut state, the shutter 52 is moved to the position indicated by dotted lines to block the light from the mercury lamp 51, so that the light does not reach the secondary lens 53, primary mirror 54, slit 55, and toroidal mirror 56 in the illumination system 65.

A problem in the conventional apparatus 50 is that the short-wavelength light that interacts with the photoresist also interacts to some extent with the optical elements in the illumination system 65, gradually clouding or darkening the coatings on their surfaces, for example. Since these optical elements are exposed to all emitted wavelengths in both the exposure state and the alignment state, they receive continuous exposure to short-wavelength light during these two states. As a result, these optical elements, more specifically the secondary lens 53, primary mirror 54, and toroidal mirror 56, tend to degrade comparatively quickly.

Continuous exposure to the light emitted by the mercury lamp 51 during the alignment and exposure states also raises the optical elements in the illumination system 65 to a comparatively high temperature. In the shut state, in which the shutter 52 is closed, these optical elements receive no illumination, and their temperature falls back toward room temperature. As the apparatus 50 cycles repeatedly among the shut, alignment, and exposure states, the optical elements in the illumination system 65 undergo repeated large temperature swings, which affect their optical properties and contribute to the degradation thereof.

SUMMARY OF THE INVENTION

An object of the present invention is to reduce the degradation of optical elements in an apparatus for projecting a mask pattern onto a wafer.

A further object is to reduce temperature variations in the illumination system of the apparatus.

The invented apparatus has an illumination system providing light for use in alignment and exposure, and a projection system using the provided light to project a mask pattern onto a wafer. The illumination system has a light source, two light selectors, and at least one optical element disposed between the two light selectors. The first light selector has an alignment filter, which it selectively places between the light source and the optical element, in the path of the light emitted by the light source. The second light selector has at least an exposure filter and a shutter, which it selectively places between the optical element and the projection system, in the path of the light received from the optical element.

The apparatus can be operated in a shut state, an alignment state, and an exposure state. The alignment filter is placed in the light path in the shut state and the alignment state, and is removed from the light path in the exposure state.

Degradation of the optical element is reduced because the optical element is exposed to unfiltered light only in the exposure state, and not in the alignment state.

Temperature variations are reduced because the optical element is illuminated in the shut state, as well as in the alignment state and exposure state.

DETAILED DESCRIPTION OF THE INVENTION

Figure 1:
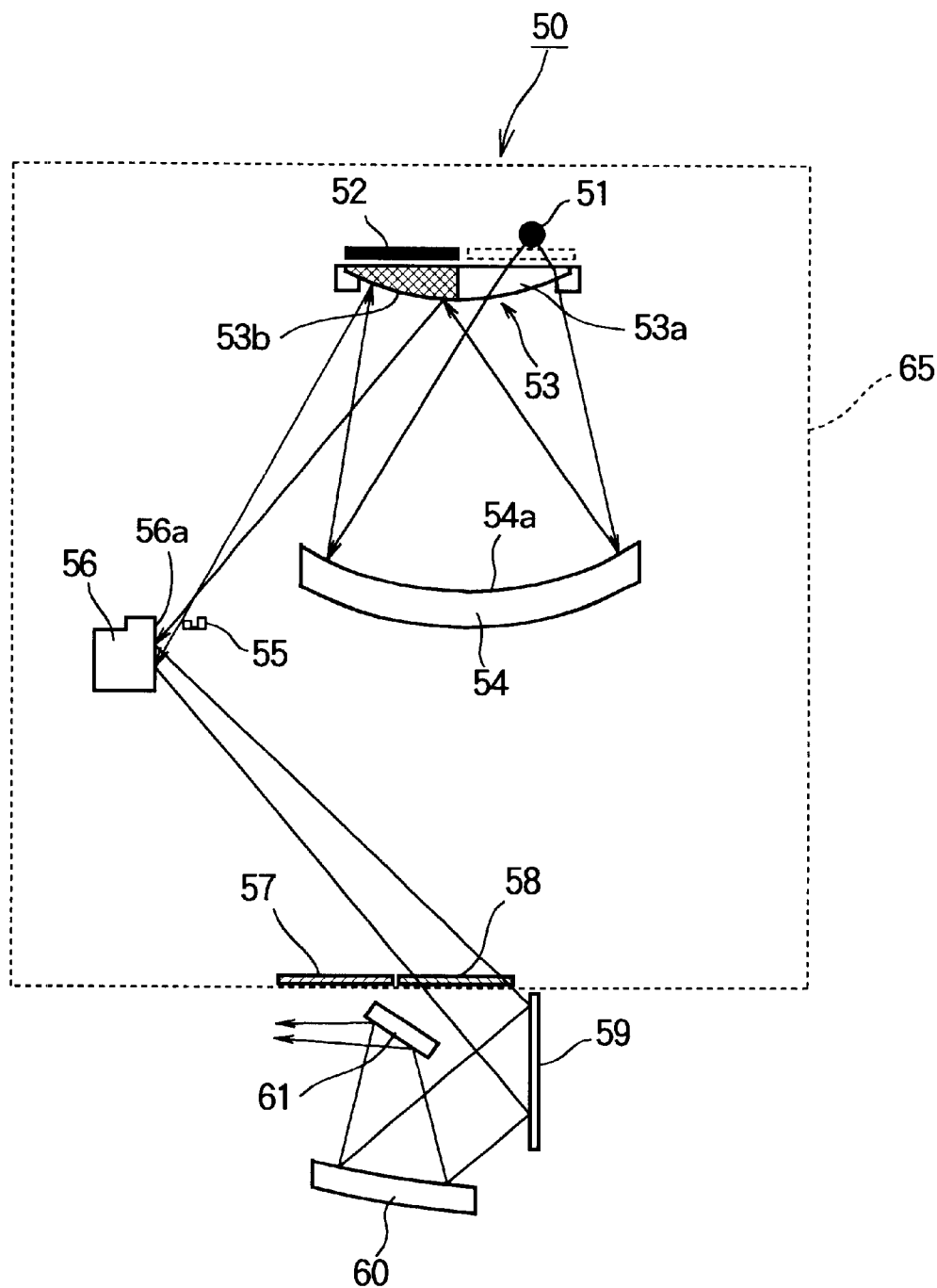
FIG. 1 is a schematic sectional view illustrating part of a conventional light-exposure apparatus in the alignment state.

Embodiments of the invention will be described with reference to the attached drawings, in which like parts are indicated by like reference characters.

Figure 2:
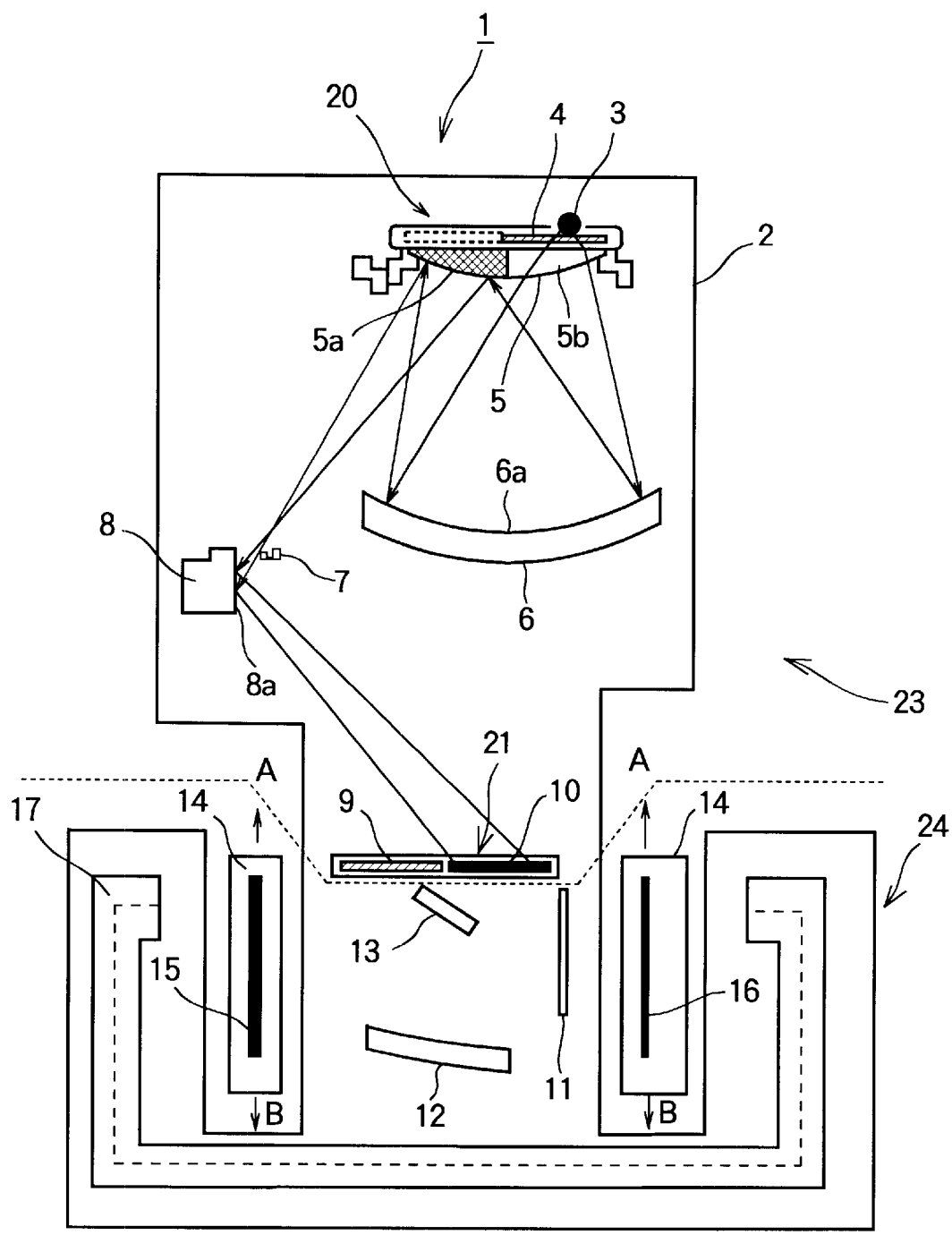
FIG. 2 is a schematic sectional view of a first novel light-exposure apparatus in the shut state.
Figure 3:
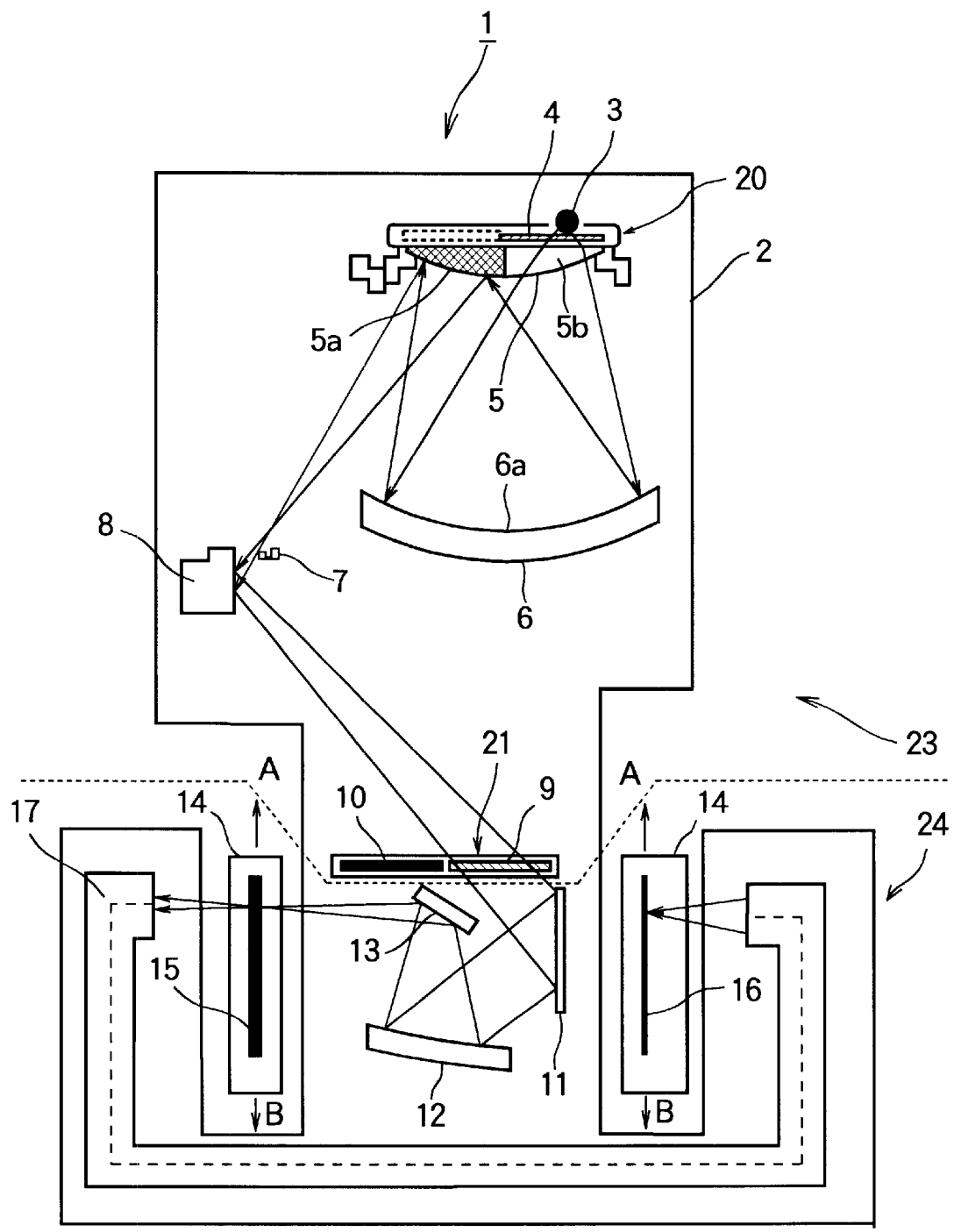
FIG. 3 is a schematic sectional view of the first novel light-exposure apparatus in the alignment state.
Figure 4:
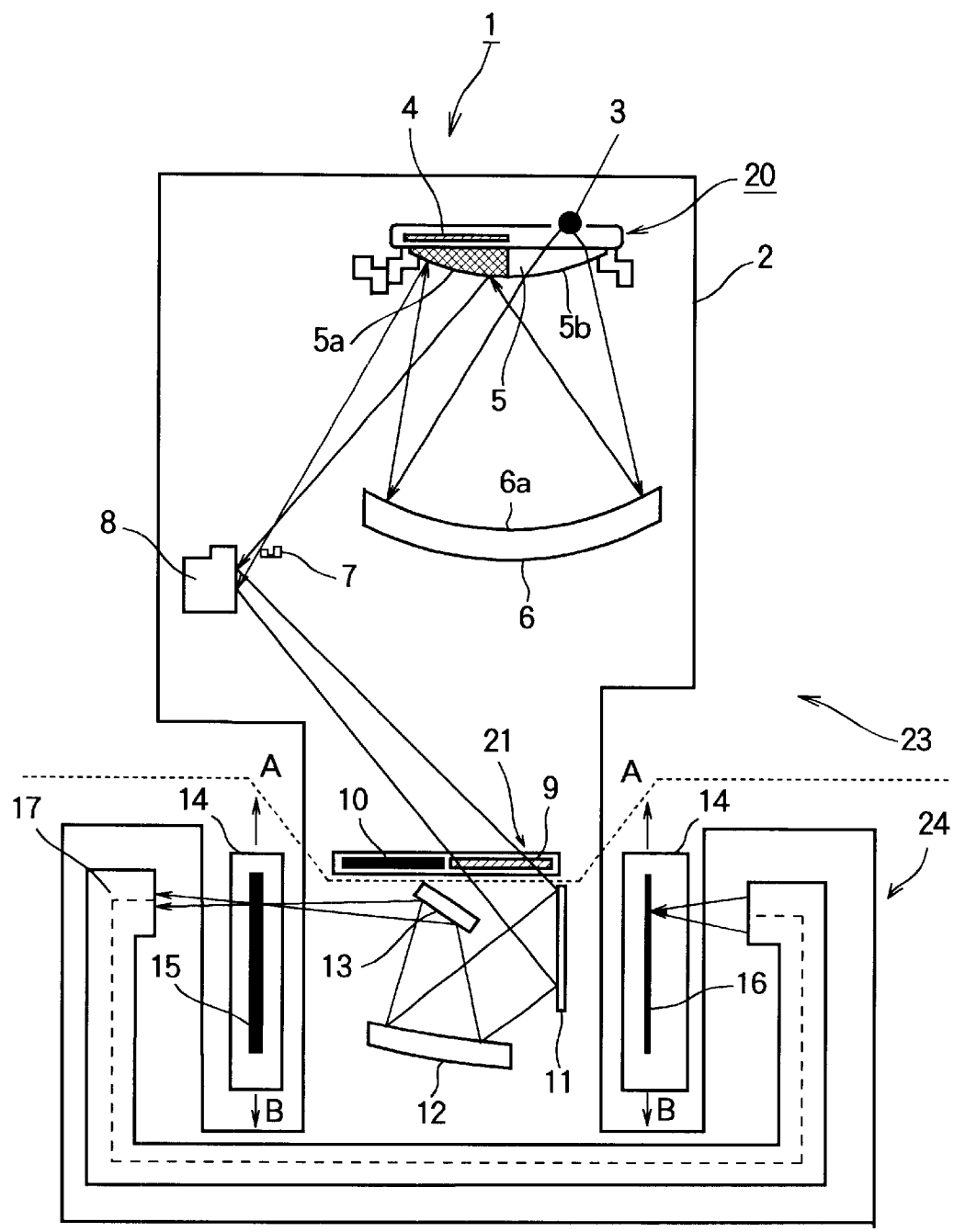
FIG. 4 is a schematic sectional view of the first novel light-exposure apparatus in the exposure state.

As a first embodiment, FIGS. 2 3, and 4 show a novel light-exposure apparatus 1 in the shut state, the alignment state, and the exposure state, respectively. The structure of the apparatus 1 will be described with reference mainly to FIG. 2.

The apparatus 1 has a housing 2 in which a mercury lamp 3 is mounted in a fixed position behind an alignment filter 4 and a secondary lens 5. The secondary lens 5 is a planoconvex lens with a flat surface and a curved surface. The alignment filter 4 is mounted between the flat surface and the mercury lamp 3, but can be moved as described below. The curved surface is partly coated with an aluminum film, so that the secondary lens 5 has a reflecting part 5a as well as a transmitting part 5b. The mercury lamp 3 is positioned behind the transmitting part 5b.

The alignment filter 4 is mounted in a first manually movable mount 20. This mount 20 permits the alignment filter 4 to be moved between the position shown in FIGS. 2 and 3, adjacent the transmitting part 5b of the secondary lens 5, and the position shown in FIG. 4, adjacent the reflecting part 5a. The alignment filter 4 and first movable mount 20 form a first light selector.

The convex surface of the secondary lens 5 faces the spherically concave reflecting surface 6a of a primary mirror 6. Light emitted through the transmitting part 5b of the secondary lens 5 is reflected from substantially all parts of the reflecting surface 6a of the primary mirror 6, and converges onto the reflecting part 5a of the secondary lens 5.

The light reflected from the reflecting part 5a of the secondary lens 5 passes through a slit 7 and encounters the reflecting surface 8a of a toroidal mirror 8 that extends in an arc perpendicular to the drawing sheet. The slit 7 and toroidal mirror 8 are disposed so that the reflecting surface 8a of the toroidal mirror 8 is illuminated by a substantially uniform band of light, with equal intensity at the center and both ends. This band of light is reflected from the toroidal mirror 8 toward a first relay mirror 11.

Disposed between the toroidal mirror 8 and the first relay mirror 11 are an exposure filter 9 and a shutter 10, mounted in a second manually movable mount 21. The positions of the exposure filter 9 and shutter 10 are interchangeable: in the shut state, the shutter 10 is positioned on the light path between the toroidal mirror 8 and first relay mirror 11, as shown in FIG. 2; in the alignment state and exposure state, the exposure filter 9 occupies this position, as shown in FIGS. 3 and 4. The exposure filter 9, shutter 10, and second manually movable mount 21 form a second light selector.

Light reaching the first relay mirror 11 is reflected to a second relay mirror 12, then to a third relay mirror 13. A movable carriage 14 holds a mask 15 and a wafer 16 on opposite sides of the three relay mirrors 11, 12, 13. The light reflected by the relay mirrors 11, 12, 13 passes through the mask 15 and is transmitted by a projection guide 17 to the wafer 16, thereby projecting an image of the mask pattern onto the surface of the wafer 16. The carriage 14 is constructed so that the relative positions of the mask 15 and wafer 16 can be adjusted. The carriage 14 can also be moved as a whole in the direction of the arrows A and B, perpendicular to the optic axis of the incident light, by a mechanism not shown in the drawings.

The elements from the mercury lamp 3 to the second movable mount 21 form an illumination system 23 that furnishes the light needed for alignment and exposure. The remaining elements form a projection system 24 that projects the light through the mask 15 onto the wafer 16.

The mercury lamp 3 emits light of various wavelengths, including an alignment wavelength (e.g., 546 nm) in the visible part of the spectrum, and an exposure wavelength (e.g., 365 nm) in the ultraviolet part. The alignment wavelength is used for aligning the mask 15 and wafer 16; the exposure wavelength is used for transferring the mask pattern to the wafer 16. Incidentally, 'nm' is an abbreviation for nanometers.

The alignment filter 4 is an optical filter that transmits wavelengths equal to or longer than a predetermined wavelength $\alpha$ (e.g., 500 nm), and blocks wavelengths shorter than $\alpha$. The predetermined wavelength $\alpha$ is disposed between the exposure wavelength and the alignment wavelength.

The exposure filter 9 is an optical filter that transmits wavelengths equal to or longer than a shorter predetermined wavelength $\beta$ (e.g., 320 nm), and blocks wavelengths shorter than $\beta$. The predetermined wavelength $\beta$ is shorter than the exposure wavelength.

The operation of the first embodiment in the shut state, the alignment state, and the exposure state will be described below.

In the shut state, the movable mounts 20, 21 are set manually so that the alignment filter 4 and shutter 10 are positioned on the light path, as illustrated in FIG. 2. In the illumination system 23, light emitted by the mercury lamp 3 travels on a first path through the alignment filter 4, which removes wavelengths shorter than the above-mentioned wavelength $\alpha$ (e.g., 500 nm). The secondary lens 5, primary mirror 6, slit 7, and toroidal mirror 8 reshape the transmitted light into a rectangular beam, and redirect the beam on a second path to the second movable mount 21. There the beam is blocked by the shutter 10.

In the alignment state, the movable mounts 20, 21 are set manually to place the alignment filter 4 and exposure filter 9 on the light path, as illustrated in FIG. 3. Both of these filters transmit wavelengths equal to or longer than $\alpha$, and the alignment filter 4 blocks wavelengths shorter than $\alpha$. Light of wavelengths equal to or longer than $\alpha$ passes through the alignment filter 4, is reshaped and redirected as described above, then passes through the exposure filter 9 into the projection system 24.

The three relay mirrors 11, 12, 13 in the projection system 24 direct the reshaped light beam onto the mask 15. Light passing through the mask 15 is projected onto the wafer 16. The relative positions of the mask 15 and wafer 16 are now adjusted so that the mask pattern projected into the wafer 16 is correctly aligned with existing features or marks on the wafer 16. The wafer 16 is coated with a photoresist that is insensitive to wavelengths equal to or longer than the above-mentioned wavelength $\alpha$, so the photoresist is unaffected by the light incident on it during the alignment process.

In the exposure state, the movable mounts 20, 21 are set manually to remove the alignment filter 4 from the first light path and place the exposure filter 9 on the second light path, as illustrated in FIG. 4. Light emitted by the mercury lamp 3 is reshaped into a rectangular beam by the secondary lens 5, primary mirror 6, slit 7, and toroidal mirror 8, without being filtered by the alignment filter 4. Wavelengths equal to or longer than the above-mentioned wavelength $\beta$ (e.g., 320 nm) are transmitted through the exposure filter 9 into the projection system 24. The three relay mirrors 11, 12, 13 again direct the beam onto the mask 15, thereby projecting a mask pattern onto the wafer 16.

The photoresist with which the wafer 16 is coated is sensitive to the exposure wavelength, which is longer than $\beta$, so the mask pattern is transferred to the photoresist. The carriage 14 is moved at a predetermined rate in the direction of the arrows A and B, enabling the entire mask pattern to be transferred.

As described above, the secondary lens 5, primary mirror 6, and toroidal mirror 8 remain illuminated throughout the operation of the light-exposure apparatus 1, even in the shut state, so they are not subjected to extreme temperature variations and their optical properties are comparatively unaffected by thermal stress. They are illuminated by the unfiltered light of the mercury lamp 3 only in the exposure state, however. In the alignment state, the alignment filter 4 removes wavelengths shorter than the above-mentioned wavelength α. The secondary lens 5, primary mirror 6, and toroidal mirror 8 therefore suffer less optical damage and last longer than in the conventional apparatus, because the time for which they are exposed to high-energy short wavelengths (less than α) is reduced.

Next, a second embodiment will be described.

Figure 5:
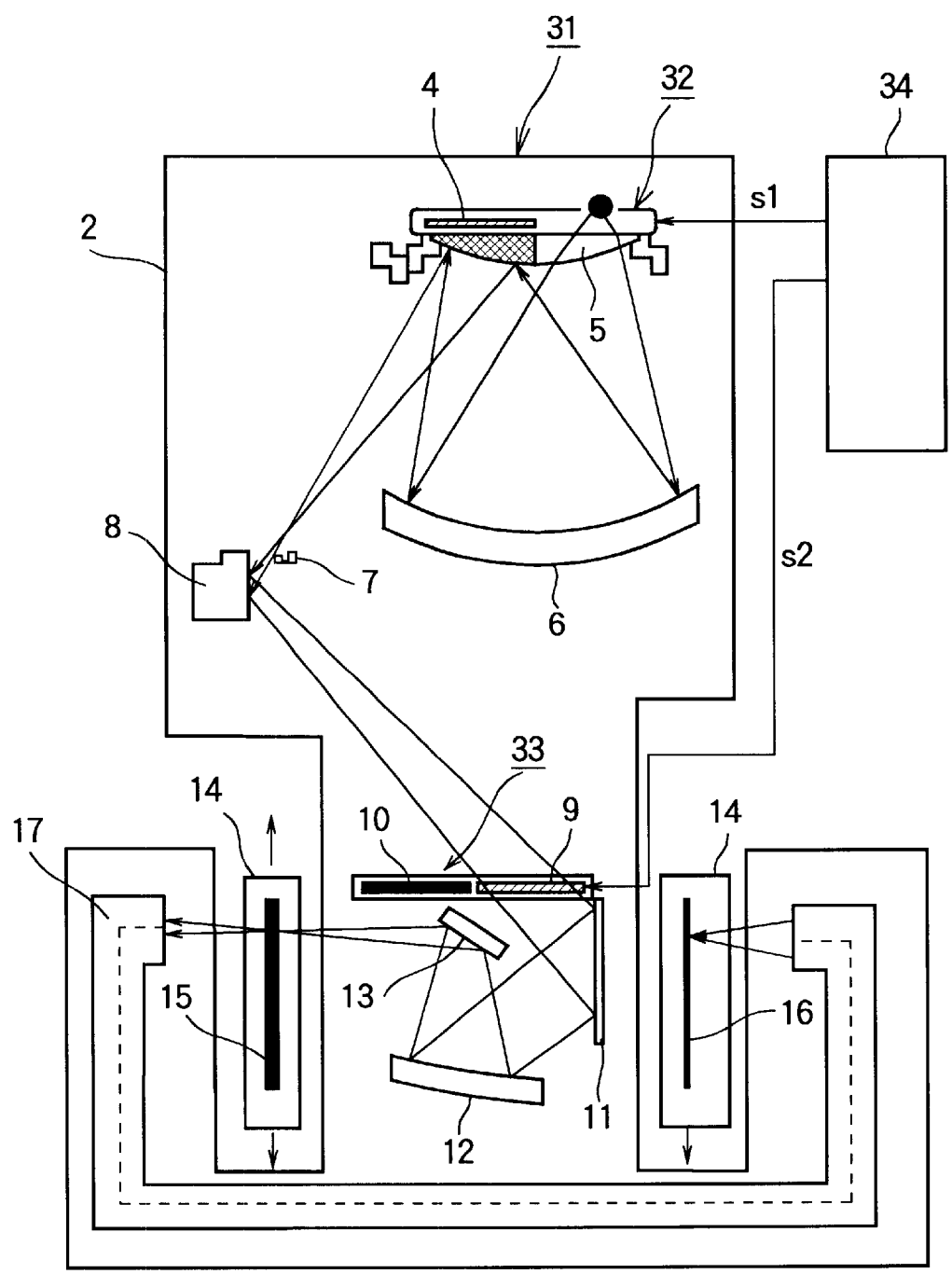
FIG. 5 is a schematic sectional view of a second novel light-exposure apparatus in the exposure state.

FIG. 5 shows the second embodiment in the exposure state. In the light-exposure apparatus 31 in the second embodiment, the alignment filter 4 is mounted in a first automatically movable mount 32 that is driven by a driving signal s1. The exposure filter 9 and shutter 10 are mounted in a second automatically movable mount 33 driven by a driving signal s2. The driving signals s1, s2 are generated by a control unit 34. The control unit 34 may be manually operated, or may output the driving signals s1, s2 according to a prestored program.

In the shut state, the control unit 34 generates driving signals s1, s2 that automatically cause the movable mounts 32, 33 to position the alignment filter 4 and shutter 10 in the light path.

In the alignment state, the control unit 34 generates driving signals s1, s2 that automatically cause the movable mounts 32, 33 to position the alignment filter 4 and exposure filter 9 in the light path.

In the exposure state, the control unit 34 generates driving signals s1, s2 that automatically cause the first movable mount 32 to remove the alignment filter 4 from the light path, and the second movable mount 33 to position the exposure filter 9 in the light path.

The second embodiment provides the same effects as the first embodiment, and has the additional advantage of simplified operation, not requiring manual manipulation of the movable mounts 32, 33.

In a variation of the first and second embodiments, the second movable mount 21 or 33 can be set to a position in which both the exposure filter 9 and shutter 10 are removed from the light path, and the light reflected from the toroidal mirror 8 is passed directly to the first relay mirror 11. This position is used during alignment, so that the light is filtered only by the alignment filter 4, and not by the exposure filter 9. Accordingly, the exposure filter 9 does not have to transmit light of the wavelengths used for alignment purposes.

In another variation of the first and second embodiments, the first movable mount 20 or 32 also has an optically neutral element such as a transparent glass plate that is moved into the light path for protective purposes in the exposure state, to protect the lenses and mirrors of the illumination system from dust, for example, without attenuating the emitted light.

The invention is not limited to the wavelengths mentioned above or to the use of a mercury lamp as the light source; other wavelengths and other types of light sources may be used.

Use of the terms 'alignment wavelength' and 'exposure wavelength' does not imply that either the alignment process or the exposure process is limited to a single wavelength.

Those skilled in the art will recognize that further variations are possible within the scope claimed below.

What is claimed is:

1. An apparatus having an illumination system for providing light, and a projection system using the light to project a mask pattern from a mask onto a wafer, wherein the illumination system comprises:

a light source emitting light on a first path, the emitted light including an alignment wavelength used for alignment of the mask and the wafer, and an exposure wavelength used to transfer the mask pattern to the wafer;

a first light selector disposed on the first path, having an alignment filter that transmits the alignment wavelength and blocks the exposure wavelength, the first light selector selectively placing the alignment filter in the first path and removing the alignment filter from the first path;

at least one optical element receiving said light from the first light selector on the first path, and redirecting the received light as a beam with an altered beam profile on a second path; and a second light selector having at least an exposure filter and a shutter, the exposure filter transmitting at least the exposure wavelength, the second light selector receiving said beam from said at least one optical element on the second path, selectively placing the exposure filter in the second path to transmit the exposure wavelength of said beam to the projection system, and placing the shutter in the second path to block said beam.

2. The apparatus of claim 1, further comprising a control unit for operating the apparatus in a shut state, an alignment state, and an exposure state by controlling the first light selector and the second light selector, wherein:

in the shut state, the control unit causes the first light selector to place the alignment filter in the first path and the second light selector to place the shutter in the second path;

in the alignment state, the control unit causes the first light selector to place the alignment filter in the first path and the second light selector to remove the shutter from the second path; and in the exposure state, the control unit causes the first light selector to remove the alignment filter from the first path and the second light selector to place the exposure filter in the second path.

3. The apparatus of claim 2, wherein the exposure filter also transmits the alignment wavelength, and the control unit causes the second light selector to place the exposure filter in the second path in the alignment state.

4. The apparatus of claim 1, wherein the illumination system comprises, as said at least one optical element, a secondary lens, a primary mirror, a slit, and a toroidal mirror.

5. The apparatus of claim 1, wherein the alignment filter is an optical filter that transmits wavelengths longer than a first wavelength and blocks wavelengths shorter than the first wavelength, and the exposure filter is an optical filter that transmits wavelengths longer than a second wavelength and blocks wavelengths shorter than the second wavelength, the first wavelength being longer than the second wavelength.

6. The apparatus of claim 5, wherein the first wavelength is substantially five hundred nanometers.

7. The apparatus of claim 5, wherein the second wavelength is substantially three hundred twenty nanometers.

* * * * *